Aug. 5, 1969 W. W. KIFFMEYER 3,460,000
STABILIZED CONTROL CIRCUIT
Filed Nov. 16, 1965

INVENTOR.
WILLIAM W. KIFFMEYER
BY Thomas E. Schatzel

United States Patent Office 3,460,000

Patented Aug. 5, 1969

3,460,000

STABILIZED CONTROL CIRCUIT

William W. Kiffmeyer, Shorewood, Wis., assignor to Allen-Bradley Company, Milwaukee, Wis., a corporation of Wisconsin Filed Nov. 16, 1965, Ser. No. 508,033

Int. Cl. H01h 47/32

U.S. Cl. 317—148.5 8 Claims

ABSTRACT OF THE DISCLOSURE

A control circuit for operating a load having an operating frequency substantially less than the electrical frequency of the input control signal and including a trigger network, a delay storage network, a bistable electric load and possibly a feedback network. The storage and feedback networks protect against extraneous signals affecting the desired circuit operation.

The present invention in general relates to an electronic control device and more particularly to an electronic control device of improved stability and of which the maximum frequency of operations of the controlled load is substantially less than the frequency of the control signal.

There are various applications for the present control circuit. One application, as illustrated herein in detail, is in conjunction with a proximity switch system. A proximity switch system may be viewed as a device for detecting the presence or position of an object, without necessarily making physical contact with the object. An accepted type of proximity switch system is one which is sensitive to a change in the magnetic characteristics of the surroundings which may result from the presence or position of a metallic object. This type of proximity switch may include a high frequency oscillating circuit; a trigger network having bistable switching operations and receiving at its input the signals of the oscillator with the switching operation dependent on the amplitude of the oscillator signal; and a bistable load, e.g., a relay, electric counter, signal, alarm, lamp, etc., the control of which is dependent on the signals delivered by the trigger circuit and of which the number of operations per a given period of time is substantially less than the frequency of the oscillator signals. The amplitude of the oscillator signals, which are delivered to the trigger circuit are determined by the proximity of the object to the oscillator circuit. Commonly, a sensor head which senses the proximity of an object and the change in magnetic characteristics is part of the oscillator circuitry. As a magnetic object approaches the sensor head the amplitude is altered.

Frequently, a proximity switch is employed in areas where there are various extraneous signals which signals are superimposed on the oscillator signals. These extraneous signals may be the results of noise from operating machinery or other electronic equipment. The extraneous signals may alter the amplitude of the signal applied to the trigger circuit thereby resulting in response instability of the system such that inaccurate or false control signals are delivered to the load.

Detection stability of proximity switch systems is important, as utility of the systems is impaired if it is overly sensitive to extraneous signals. The present invention provides a control circuit which may be utilized in proximity switch systems to provide improved detection stability. The control circuit includes a delay energy storage network receiving the control signals of the trigger network. Charge and discharge of the energy storage network is dependent on the operation of the trigger network and response of the load is determined by the magnitude of the stored energy. The storage network is referred to herein as a delay energy storage network as it is selected such that a number of cycles of input signals are required before the magnitude of the stored energy reaches a point to actuate the bistable load. Such a delay decreases sensitivity to extraneous signals since to be detrimental, the extraneous signal must be present for a time period exceeding the time delay. To further improve the stability, a feedback signal dependent upon the voltage of the delay energy storage network may be applied to the input of the trigger circuit thereby altering the bias point of the trigger circuit, i.e., there is a voltage differential between the bias levels of the trigger network when feedback exists as compared to when there is no feedback.

Accordingly, it is an object of the present invention to provide an improved stabilized control circuit adapted for operating a load having a response time substantially greater than the period of the input control signal to the control circuit.

The foregoing and other objects will appear in the description to follow. In the description, reference is made to a specific embodiment in which this invention may be practiced, but it is to be understood that other embodiments of the invention may be used and that changes may be made without deviation from the scope of the invention. Consequently, the following detailed description is not to be taken in a limiting sense; instead, the scope of the invention is best defined by the appended claims.

Figures 1, 2, 3:
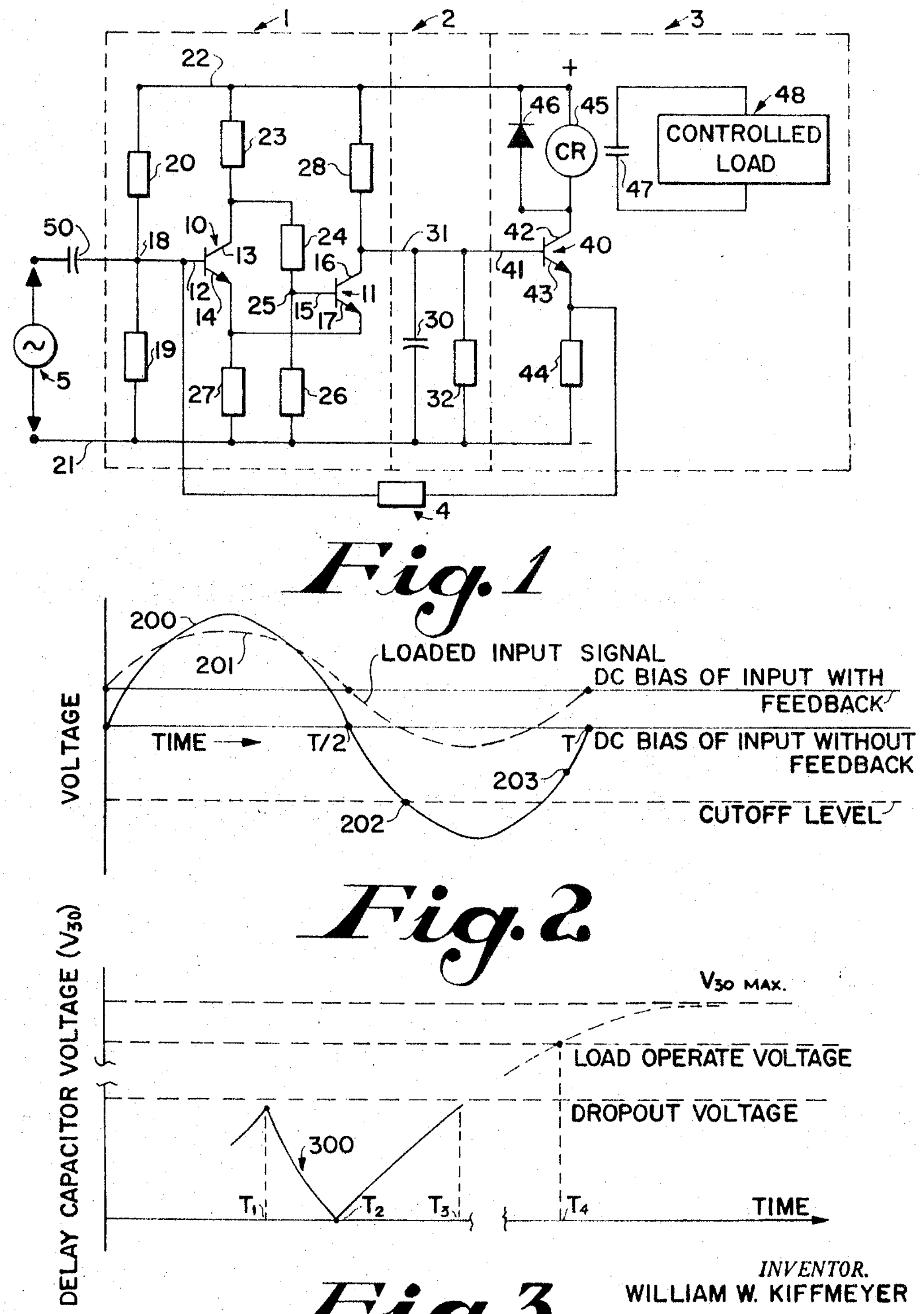
FIG. 1 illustrates a diagrammatic wiring diagram of a control circuit incorporating the principles of the present invention. The control circuit is illustrated as adapted to receive a high frequency control signal to control a bistable load in the form of a relay.
FIG. 2 illustrates one cycle of an input signal to the circuit of FIG. 1 when the circuit is operating under normal conditions and one cycle of an input signal when the circuit is operating under loaded conditions.
FIG. 3 illustrates the voltage designated $V_{30}$, across the delay capacitor of the delay energy storage network of FIG. 1 versus time.

The circuitry of FIG. 1 may be viewed as divided into various parts: a trigger network included within the broken-line block diagram designated by the general reference character 1; a delay energy storage network included within the broken-line block diagram designated by the general reference character 2; an amplifier circuit including the controlled load within the broken-line block diagram designated by the general reference character 3; a feedback circuit designated by the general reference character 4; and a high frequency signal source designated by the general reference character 5.

The trigger network 1 provides bistable switching operations and includes a pair of control valves in the form of NPN transistors referred to by the general reference characters 10 and 11. The transistor 10 has a control or base electrode 12, a collector electrode 13 and an emitter electrode 14. The transistor 11 has a control or base electrode 15, a collector electrode 16 and an emitter electrode 17. The base electrode 12 of the transistor 10 is connected to a junction point 18 which is also common to a pair of resistors 19 and 20. The other terminal of the resistor 19 is joined to a common ground point 21. The other terminal of the resistor 20 is joined to a common potential point 22. Though not indicated on the drawing, it is to be understood that a D.C. voltage supply source provides a potential difference between the points 21 and 22. Intermediate the collector electrode 13 and the potential point 22 is a resistive element 23. Also joining the collector electrode 13 is one terminal of a resistive element 24 with the other terminal of the resistive element 24 tied to a junction point 25. The junction point 25 is common to the base electrode 15 of the transistor 11 and to one terminal of a resistive element 26. The other terminal of the resistive element 26 is common to the ground point 21. Joining the emitter electrode 14 of the transistor 10 is one terminal of a resistive element 27 with the other terminal common to the ground point 21. Also joining the emitter electrode 14 is the emitter electrode 17 of the transistor 11. Completing the circuitry of the trigger network 1 is a resistive element 28 extending between the potential point 22 and the collector electrode 16 of the transistor 11.

The delay energy storage network 2 includes a capacitive element 30 extending between the ground point 21 and a junction point 31 which is common to the collector electrode 16 of the transistor 11. In parallel with the capacitor 30 is a resistive element 32.

The amplifier circuitry 3 includes a control valve in the form of a NPN transistor referred to by the general reference character 40. The transistor 40 has control or base electrode 41, a collector electrode 42 and an emitter electrode 43. The base electrode 41 is common to the junction point 31. The emitter electrode 43 is common to one terminal of a resistive element 44 with the other terminal common to the ground point 21. The collector 42-emitter 43 circuit of the transistor 40 extends to the bistable device to be controlled. Herein such as device is illustrated as a relay coil 45 extending between the collector electrode 42 and the D.C. potential point 22. In parallel with the coil 45 is a unidirectional conducting device in the form of a diode 46, with the cathode of the diode 46 common to the point 22 and the anode common to the collector 42. The circuit further includes a pair of normally-open relay contacts 47 actuation of which is controlled by the potential across the coil 45. The contacts 47 are connected across a controlled load designated by the block diagram 48. The load 48 is designed to be controlled according to the electrical "open" or "closed" relationship of the contacts 47.

A feedback path from the emitter electrode 43 of the transistor 40 is provided by the resistor 4 which extends to the base electrode 12 of the transistor 10. Thus, the bias of the transistor 10 is determined by the combination of the resistors 4, 19 and 20. The input signals to the trigger network 1 is provided by a high frequency signal source designated by the circular diagram 5 which extends between the ground point 21 and one side of an electrical storage element in the form of a capacitor 50. The other side of the capacitor 50 is common to a junction point 18.

The operation of the circuitry of FIG. 1 is believed to be as hereinafter stated. The signal source 5 provides a high frequency signal to the base electrode 12 of the transistor 10. The source 5 may be an oscillator circuit consisting of a sensor coil and a capacitive network which oscillates at a preset normal frequency. The oscillator may be further designed such that the sensor coil produces a magnetic flux. When a metallic object, the presence or position of which is to be detected, enters the flux pattern of the sensor coil, eddy currents are induced in the metallic object and the oscillator loads down. The amplitude of the signal to the base 12 is decreased according to the proximity of the object with the sensor. For example, in FIG. 2 the curve 200 illustrates one cycle of the normal alternating current wave of the oscillator circuitry 5 in the absence of influence by an external object. The curve 201 of FIG. 2 illustrates the one cycle of a loaded oscillator signal when a metallic object is within proximity of the sensor coil and loading down the coil by inducing eddy currents in the metallic object. The time period of each cycle 200 and 201 is designated T and the half-time period *T*/2.

The signal from the source 5 is applied to the control or base electrode 12 of the transistor 10. The transistor 10 is biased "on" by the biasing resistors 4, 19 and 20. During the time the transistor 10 is "on" the transistor 11 is "off," since the base 15-emitter 17 junction is reverse biased, and the capacitor 30 charges through the resistor 28. The transistor 10 also has a cut-off level, which if exceeded places the transistor 10 in a non-conductive state because the base 12-emitter 14 junction is then reverse biased. This is illustrated in part by the signal curve 200 of FIG. 2. As the magnitude of the signal 200 increases in a negative direction, the cut-off point 202 is realized. The transistor 10 then turns "off"; the voltage across the resistors 24 and 26 approaches the voltage between the terminals 22 and 21 as the voltage across the resistor 27 decreases and the transistor 11 turns "on." When the transistor 11 turns "on," the capacitor 30 discharges through the resistor 27 and the collector 16-emitter 17 path of the transistor 11.

As the incoming signal to the base 12 of the transistor 10 drives positive, a voltage will be reached at which the base 12-emitter 14 junction of the transitor 10 is no longer reverse biased. Then the transistor 10 again is switched "on" and the base 15-emitter 17 junction of the transistor 11 is reverse biased due to the increasing voltages across the resistor 23 and 27. This, in turn, turns the transistor 11 "off" and the capacitor 30 again commences to charge. The point at which the transistor is again switched "on" is indicated on the curve 200 by the point 203. Thus, the transistor 11 is switched "on" during the time period between the points 202 and 203. This bistable switching action during each cycle of incoming signals continues as long as the incoming signal is of sufficient amplitude to drive the transistor 10 into "cut-off" (non-conduction) during part of the cycle. During this switching action, the capacitor alternately charges and discharges.

If the amplitude of the incoming signal decreases to a value which no longer drives a transistor 10 into "cut-off," the transistor 10 conducts throughout the entire cycle, the transistor 11 will remain "off" and the capacitor 30 charges continuously. Such an incoming signal is illustrated by the diagram 201 of FIG. 2. The curve 201 never reaches a negative value sufficient to "cut-off" the transistor 10. Consequently, the voltage across the delay capacitor 30 continues to increase approaching a maximum value determined by the voltage dividing action of the resistors 28, 32 and the input impedance of the transistor 40.

The charge and discharge action of the delay capacitor 30 is illustrated by the curve form 300 of FIG. 3. The curve 300 in FIG. 3 illustrates the voltage $V_{30}$ across the capacitor 30 versus time. The curve was selected to begin at an arbitrary time. The time designed as $T_1$ coincides this the point 202 of FIG. 2 and is the point the transistor 11 commences to conduct. During the time duration between $T_1$ and $T_2$, the capacitor 30 has a discharge path through the collector 16, the emitter 17 and the resistor 27 to the ground point 21. The slope of the discharge signal is determined by the time constant of the discharge path. The time designated $T_2$ is the point at which the transistor 10 again conducts turning the transistor 11 "off" such that the capacitor 30 again charges. The time $T_2$ coincides with the point 203 of FIG. 2. The slope of the charge path of the capacitor 30 is determined by the time constant of the voltage divider including the capacitor 30, the resistor 28, the resistor 32, and the input impedance of the transistor 40. Under normal conditions at the time $T_3$, the transistors 10 and 11 would again switch such that the capacitor 30 would commence its discharge cycle similar to that cycle between the time periods $T_1$ and $T_2$. However, if the signal source is loaded down, as indicated by the curve 201, cut-off for transistor 10 is not reached and the transistors 10 and 11 do not switch. The transistor 10 remains "on" and the capacitor 30 continues to charge and the voltages across the resistor 44 and the coil 45 continues to increase. If the incoming signal continues to fail to reach a magnitude sufficient to switch the transistors 10 and 11, after a substantial number of cycles, depending on the time constant of the delay energy storage network and the frequency of the incoming signal, the charge across the capacitor 30 approaches a point designed "load operate voltage." This point is indicated on FIG. 3 and is the point at which the potential across the relay coil 45 is sufficient to actuate the relay contacts 47. Upon actuation of the contacts 47, the load 48 is controlled. If the capacitor continues to charge the voltage $V_{30}$ approaches a maximum value designated $V_{30}$ max which value is dependent on the voltage dividing action of the resistors 28, 32 and the input impedance of the transistor 40. The contacts 47 remain closed until the potential across the capacitor 30 drops below a value designated "dropout voltage" on the curve of FIG. 3. This condition will arise when the transistors 10 and 11 return to the bistable switching state and remain in the switching state for a sufficient length of time to permit the capacitor 30 to discharge below the "dropout voltage" level.

It shall be realized that a considerable amount of time, in relationship to the time period of the input signal, elapse before the coil 45 is energized sufficiently to actuate the contacts 47. It is common for the frequency of the input signal 5 to be in the magnitude of several kilocycles while the response of the relay 45 is in the order of approximately one hundred switching operations per second. Thus, the effect of extraneous signals, line transients, etc., on the circuit are limited to those existing for at least the time duration required for the capacitor 30 to charge to the "load operate voltage" or for the capacitor 30 to discharge to the "dropout voltage" which revert the contacts 47 to the unactuated state. The contacts 47 will remain in the unactuated state so long as the transistors 10 and 11 continue to switch "on" and "off" with the incoming signal to the base 12 of the transistor 10.

In the circuit of FIG. 1, a portion of the potential across the resistor 44 is fed back to the base electrode 12 of the transistor 10 making the bias on the transistor 10 more positive. This, in turn, causes bias voltage differential which incoming signals must overcome before the transistor 10 can be "cut-off" by the negative part of the incoming signal. This bias voltage differential is illustrated in FIG. 2 by the curve 201. The crve 201 is shifted in a positive direction away from the "cut-off" level by an amount determined by the feedback signal. This voltage differential further stabilizes the control circuit from extraneous signals appearing at the input of the trigger network 1. In other words, the extraneous signal must be of sufficient amplitude to overcome the bias supplied by the feedback path 4 and at least for a time duration sufficient for the "load operate voltage" to be reached. The design of the circuit of FIG. 1 is such that the value of the bias of the transistor 10 is increased when the transistor 10 is not driven into "cut-off" and decreases as the incoming signal magnitude overcomes the added bias. This high bias point (in respect to the cut-off point 202) not only provides protection against extraneous input signals but also greater switching stability between the transistors 10 and 11.

The previously described circuit comprises NPN transistors and a bistable output device in the form of relay contacts 47 actuated by a relay coil 45. However, an equivalent circuit utilizing PNP transistors or other active devices can be utilized. It is also feasible to realize the increased stability of the present invention by omitting the resistors 32 and 44, the amplifying transistor 40 and the relay coil 45; connecting the feedback path 4 to the collector 16 of the transistor 10, and utilizing the collector voltage of the transistor 10 as the output. The circuit may be further designed with an adjustable voltage detector differential by providing a variable resistance in the feedback path 4 thereby altering the amount of potential across the capacitor 30 applied to the base 12 of the transistor 10.

I claim:

1. A control circuit for operating a load having a operating frequency substantially less than the electrical frequency of the input control signal comprising, in combination:

a D.C. voltage supply source;

a high frequency voltage signal source, the amplitude of the voltage deviating in accordance with the control information;

a trigger network biased by the D.C. source and receiving the high frequency voltage signal, the trigger network having bistable switching operations changing from one stable state to another depending on the amplitude of the high frequency voltage signal;

a delay storage network receiving a charge signal dependent on the stable state of the trigger network, the storage network charging during one stable state and discharging during the other stable state, the storage network charging to maximum value when the trigger network remains in one stable state after a number of cycles of the high frequency signal source;

a bistable electrical load assuming either an electrically actuated or unactuated condition depending on the electrical charge of said storage network, the electrical load having a response time substantially greater than the time period of the high frequency voltage signal.

2. A control circuit in accordance with claim 1 in which the trigger network includes a Schmitt trigger circuit; and the delay energy storage network comprises a voltage divider circuit including resistive and capacitive elements, said voltage divider circuit extending across the D.C. voltage supply source and across the output of the Schmitt trigger circuit, the storage network having a charge time constant dependent on the resistive and capacitive values of said voltage divider and a discharge time constant dependent on the capacitive value of said voltage divider and the resistance of the output stage of the Schmitt trigger.

3. A control circuit in accordance with claim 2 further including an electrical signal amplifying network extending across the D.C. voltage supply source, the amplifying network including a control valve having a control element, a first electrode and a second electrode, said control valve receiving at said control element a signal dependent on the electrical energy of the delay energy storage network, said first and second electrodes extending across the D.C. voltage supply source and delivering a signal to the bistable electrical load dependent on the signal on said control element.

4. A control circuit in accordance with claim 3 in which the bistable electrical load includes a relay comprising a control coil and a pair of contacts with said coil connected in series with said first and second electrodes of said control valve, whereby the electrical signal through said first and second electrodes controls actuation of said contacts.

5. A control circuit in accordance with claim 1 including a signal feedback network extending between the energy storage network and the input of the trigger network, said feedback network supplying a voltage bias level differential to the trigger network depending on the magnitude of the electrical charge of said storage network.

6. A control circuit in accordance with claim 5 in which the trigger network includes a Schmitt trigger circuit; and the delay energy storage network comprises a voltage divider circuit including resistive and capacitive elements, said voltage divider circuit extending across the D.C. voltage supply source and across the output of the Schmitt trigger circuit, the storage network having a charge time constant dependent on the resistive and capacitive values of said voltage divider and a discharge time constant dependent on the capacitive value of said voltage divider and the resistance of the output stage of the Schmitt trigger.

7. A proximity switch system for detecting the presence or position of metallic objects comprising, in combination:

a D.C. voltage supply source;

a high frequency voltage signal source providing a signal the magnitude of which is sensitive to a change in the magnetic characteristics of the surroundings resulting from the presence or position of a metallic object to be detected;

a trigger network biased by the D.C. source and receiving the high frequency voltage signal, the trigger network having bistable switching operations and biased at a predetermined level at which the switching operation of the network changes from one stable state to another as the amplitude of the high frequency voltage signal passes through the predetermined biased value;

a delay energy storage network receiving a charge signal during one stable state of the trigger network and discharging during the other stable state, the storage network charging the maximum charge value when the trigger network remains in one stable state after a number of cycles of the high frequency signal source;

a bistable electrical load the maximum frequency of operations of which is substantially less than the frequency of the high frequency signal source, the load being electrically excited in accordance with the value of the charge of the delay energy storage network and switching from one condition to the other when the charge attains a value approaching the maximum charge value.

8. The proximity switch system of claim 7 including a feedback network extending between the input of the trigger network and the delay energy storage network, the feedback network supplying a feedback signal dependent on the magnitude of the charge of the delay energy storage network.

References Cited

UNITED STATES PATENTS 3,035,188 5/1962 Asseo.

LEE T. HIX, Primary Examiner

U.S. Cl. X.R.

307—233, 235, 254, 290